United States Patent
Yamauchi et al.

(10) Patent No.: US 8,698,277 B2
(45) Date of Patent: Apr. 15, 2014

(54) NONVOLATILE VARIABLE RESISTANCE DEVICE HAVING METAL HALOGEN OR METAL SULFIDE LAYER

(75) Inventors: Takashi Yamauchi, Kanagawa (JP); Shosuke Fujii, Kanagawa (JP); Reika Ichihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 13/233,623

(22) Filed: Sep. 15, 2011

(65) Prior Publication Data

US 2012/0205608 A1    Aug. 16, 2012

(30) Foreign Application Priority Data

Feb. 15, 2011   (JP) .................. 2011-029540

(51) Int. Cl.
- *H01L 23/52* (2006.01)
- *H01L 29/00* (2006.01)
- *H01L 47/00* (2006.01)
- *H01L 29/02* (2006.01)
- *H01L 29/04* (2006.01)
- *H01L 29/06* (2006.01)
- *G11C 11/00* (2006.01)

(52) U.S. Cl.
USPC ............ 257/530; 257/1; 257/2; 257/3; 257/4; 257/5; 257/E21.068; 257/E21.004; 365/148; 365/163

(58) Field of Classification Search
None
See application file for complete search history.

(56) References Cited

U.S. PATENT DOCUMENTS

| | | | | |
|---|---|---|---|---|
| 4,914,055 A | * | 4/1990 | Gordon et al. | 438/600 |
| 5,272,666 A | * | 12/1993 | Tsang et al. | 365/96 |
| 6,638,820 B2 | * | 10/2003 | Moore | 438/256 |
| 6,927,411 B2 | * | 8/2005 | Kozicki | 257/4 |
| 7,786,459 B2 | * | 8/2010 | Aratani et al. | 257/2 |
| 2010/0140578 A1 | * | 6/2010 | Tian et al. | 257/2 |

FOREIGN PATENT DOCUMENTS

WO    WO 2010/079829    7/2010

OTHER PUBLICATIONS

Kuk-Hwan Kim, et al., "Nanoscale resistive memory with intrinsic diode characteristics and long endurance", Applied Physics Letters 96, (May 31, 2006), 2010, 3 pages.
Sung Hyun Jo, et al., "CMOS Compatible Nanoscale Nonvolatile Resistance Switching Memory", Nano Letters, vol. 8, No. 2, 2008, pp. 392-397.
K. Terabe, et al., "Quantized conductance atomic switch", Nature, vol. 433, Jan. 6, 2005, pp. 47-50.

* cited by examiner

*Primary Examiner* — Michael Jung
(74) *Attorney, Agent, or Firm* — Oblon, Spivak, McClelland, Maier & Neustadt, L.L.P.

(57) ABSTRACT

According to one embodiment, a nonvolatile variable resistance device includes a first electrode, a second electrode, a first layer, and a second layer. The second electrode includes a metal element. The first layer is arranged between the first electrode and the second electrode and includes a semiconductor element. The second layer is inserted between the second electrode and the first layer and includes the semiconductor element. The percentage of the semiconductor element being unterminated is higher in the second layer than in the first layer.

10 Claims, 14 Drawing Sheets

NONVOLATILE VARIABLE RESISTANCE DEVICE HAVING METAL HALOGEN OR METAL SULFIDE LAYER

CROSS-REFERENCE TO RELATED APPLICATIONS

This application is based upon and claims the benefit of priority from the prior Japanese Patent Application No. 2011-29540, filed on Feb. 15, 2011; the entire contents of which are incorporated herein by reference.

FIELD

Embodiments described herein relate generally to a nonvolatile variable resistance device and a method of manufacturing the nonvolatile variable resistance device.

BACKGROUND

A NAND flash memory is widespread as a storage device for large volume data. Currently, a reduction in cost and an increase in capacity per bit are promoted by refining a storage device.

On the other hand, it is also expected that a new storage device (hereinafter simply referred to as memory) based on an operation principle different from that of the floating flash memory in the past will be put to practical use.

For example, a two-terminal memory represented by a resistive random access memory (ReRAM) is prospective as a next-generation memory from the viewpoint of, for example, easiness in a low-voltage operation, high-speed switching, and refining. Examples of the two-terminal memory include a memory in which an amorphous silicon layer (hereinafter also referred to as a-Si layer in abbreviation) is used as a variable resistance layer. In such a two-terminal memory, to facilitate application to a large-capacity memory or the like, it is demanded that the low-voltage operation is possible even when the variable resistance layer is formed on a semiconductor substrate.

DETAILED DESCRIPTION

In general, according to one embodiment, a nonvolatile variable resistance device includes a first electrode, a second electrode, a first layer, and a second layer. The second electrode includes a metal element. The first layer is arranged between the first electrode and the second electrode and includes a semiconductor element. The second layer is inserted between the second electrode and the first layer and includes the semiconductor element. The percentage of the semiconductor element being unterminated is higher in the second layer than in the first layer.

Exemplary embodiments of a nonvolatile variable resistance device and a method of manufacturing the nonvolatile variable resistance device will be explained below in detail with reference to the accompanying drawings. The present invention is not limited to the following embodiments.

First Embodiment

Figure 1:
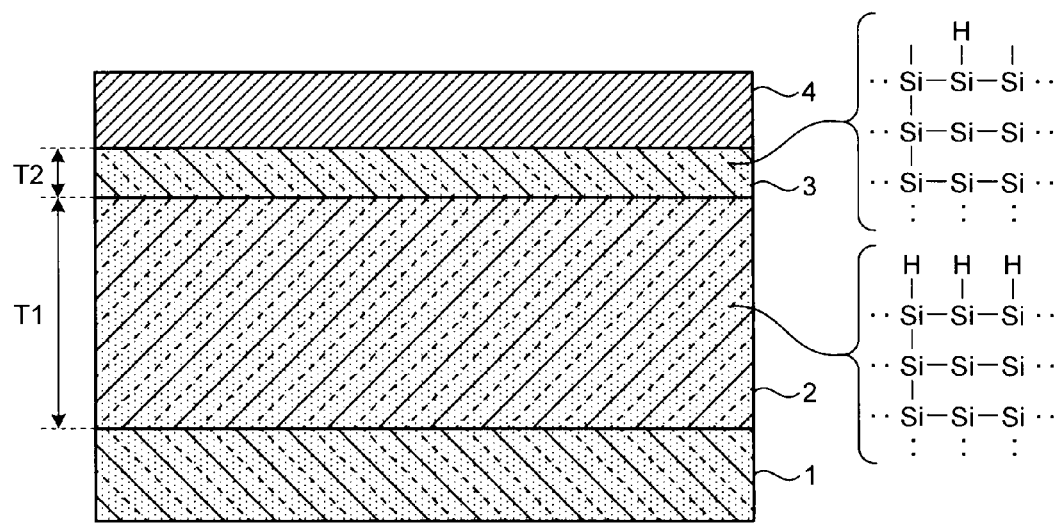
FIG. 1 is a sectional view of a schematic configuration of a nonvolatile variable resistance device according to a first embodiment.

FIG. 1 is a sectional view of a schematic configuration of a nonvolatile variable resistance device according to a first embodiment.

In FIG. 1, in this nonvolatile variable resistance device, a variable resistance layer 2 is stacked on a first electrode 1. A second electrode 4 is stacked on the variable resistance layer 2 via an ion activation layer 3.

The variable resistance layer 2 includes a semiconductor element. This semiconductor element can be selected out of Si, Ge, SiGe, GaAs, InP, GaP, GaINAsP, GaN, SiC, and the like. The variable resistance element 2 can be an amorphous semiconductor, can be a polycrystal semiconductor, or can be a monocrystal semiconductor. Nitrogen or oxygen can be added in the semiconductor element. For example, the variable resistance layer 2 can be a silicon nitride layer or a silicon oxide layer. Thickness T1 of the variable resistance layer 2 is typically 1 nanometer to 300 nanometers. When refining of an element is taken into account, the thickness is desirably small. However, because the variable resistance layer 2 is not a uniform film if the thickness is too small, thickness of 2 nanometers to 50 nanometers is more desirable.

When the semiconductor element of the variable resistance layer 2 is Si, impurity-doped silicon can be used as the first electrode 1. For example, high-density B, As, or P ions can be injected into silicon such that the resistivity of first electrode 1 is equal to or lower than 0.005 Ωcm.

The second electrode 4 includes a metal element. As this metal element, for example, Ag can be used. As the first electrode 1 and the second electrode 4, conductive materials other than Ag can be used. For example, as the first electrode 1 and the second electrode 4, Ag, Au, Ti, Ni, Co, Al, Fe, Cr, Cu, W, Hf, Ta, Pt, Ru, Zr, or Ir, a nitride or a carbide thereof, a chalcogenide material, or the like can be used. Further, an alloy material containing a plurality of metals or semiconductor elements among these metals or semiconductor elements can be used as the first electrode 1 or the second electrode 4. The first electrode 1 and the second electrode 4 can contain the same metal. However, the first electrode 1 is desirably made of a material that less easily ionized than the second electrode 4.

The ion activation layer 3 includes a semiconductor element. The percentage of the semiconductor element being unterminated is higher in the ion activation layer 3 than in the variable resistance layer 2. The percentage of the semiconductor element of the ion activation layer 3 being unterminated is desirably five or more times as high as that in the variable resistance layer 2. This semiconductor element can be selected out of, for example, Si, Ge, SiGe, GaAs, InP, GaP, GaInAsP, GaN, SiC, and the like. The ion activation layer 3 can be an amorphous semiconductor, can be a polycrystal semiconductor, or can be a monocrystal semiconductor. N or O can be added to the semiconductor element. For example, the ion activation layer 3 can be SiN, $SiO_2$, or the like.

The variable resistance layer 2 and the ion activation layer 3 can be formed of the same semiconductor element. For example, it is assumed that the variable resistance layer 2 and the ion activation layer 3 are formed of amorphous silicon and silicon atoms of the variable resistance layer 2 is terminated by nitrogen. In this case, the ion activation layer 3 can be formed to have a higher ratio of silicon atoms not terminated by nitrogen than the variable resistance layer 2.

If the ion activation layer 3 can be uniformly present between the variable resistance layer 2 and the second electrode 4, the thickness of the ion activation layer 3 is desirably small. For example, thickness T1 of the variable resistance layer 2 can be set to 39 nanometers and thickness T2 of the ion activation layer 3 can be set to 1 nanometer.

When a conductive filament formed of a metal element supplied from the second electrode 4 is formed in the variable resistance layer 2, the nonvolatile variable resistance device changes from a high-resistance state to a low-resistance state. When the metal element of the conductive filament formed in the variable resistance layer 2 is collected by the second electrode 4 and the conductive filament formed in the variable resistance layer 2 is reduced, the nonvolatile variable resistance device changes from the low-resistance state to the high-resistance state.

In the variable resistance layer 2, the metal element of the second electrode 4 is ionized to intrude into the variable resistance layer 2. When the ionized metal element is coupled to electrons, a conductive filament is formed.

On the other hand, in an unterminated section of the semiconductor element, the electrons can be deprived from the metal element to allow the metal element to be easily ionized. Activation energy for ionizing the metal element can be reduced.

Therefore, the metal element of the second electrode 4 can be easily ionized by inserting the ion activation layer 3 between the second electrode 4 and the variable resistance layer 2. Activation energy in forming a conductive filament in the variable resistance layer 2 can be reduced. Therefore, a voltage necessary for changing the resistance of the variable resistance layer 2 can be reduced.

To generate the conductive filament in the variable resistance layer 2, it is necessary to once couple the ionized metal element to the electrons and return the ionized metal to the metal element. On the other hand, because the unterminated section of the semiconductor element has a stronger action of depriving the electrons from the metal element than a terminated section of the semiconductor element, the unterminated section is an obstacle in separating out the conductive filament to the variable resistance layer 2. Therefore, in the variable resistance layer 2, the unterminated section of the semiconductor element is desirably smaller than that in the ion activation layer 3 and the thickness of the ion activation layer 3 is desirably small.

FIGS. 2A to 2D are schematic sectional views for explaining a generation process and an extinction process for a conductive filament of the nonvolatile variable resistance device shown in FIG. 1. In the following explanation, it is assumed that the metal element of the second electrode 4 is silver Ag.

Figure 2A:
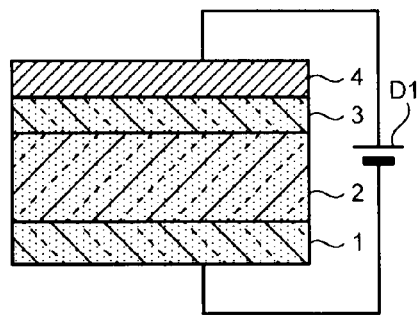
FIGS. 2A to 2D are schematic sectional views for explaining a generation process and an extinction process for a conductive filament of the nonvolatile variable resistance device shown in FIG. 1.

In FIG. 2A, in a generation process for a conductive filament F, a power supply D1 is connected between the first electrode 1 and the second electrode 4 and the second electrode 4 is set to have potential higher than that of the first electrode 1 to apply a set voltage to the second electrode 4.

Figure 2B:
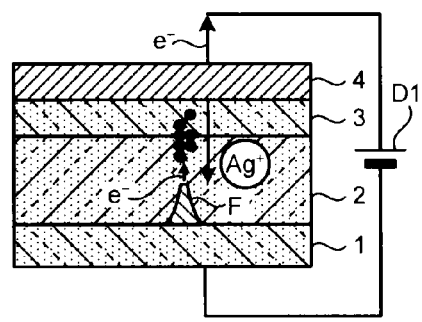

When the set voltage is applied to the second electrode 4, as shown in FIG. 2B, silver Ag of the second electrode 4 is ionized on an interface between the ion activation layer 3 and the second electrode 4, a silver ion $Ag^+$ intrudes into the variable resistance layer 2 via the ion activation layer 3, and an electron $e^-$ is supplied to the variable resistance layer 2 via the first electrode 1. In the variable resistance layer 2, the silver ion $Ag^+$ and the electron $e^-$ are coupled, whereby the conductive filament F made of silver Ag grows from the first electrode 1 side.

Figure 2C:
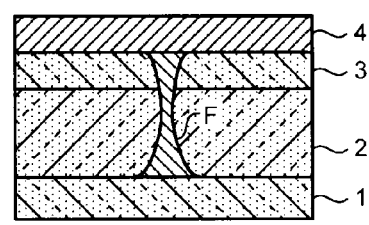

As shown in FIG. 2C, the conductive filament F made of silver Ag grows into the variable resistance layer 2 and the ion activation layer 3 and the first electrode 1 and the second electrode 4 are short-circuited in the conductive filament F. Consequently, the nonvolatile variable resistance device is set in the low-resistance state.

Because silver Ag is easily ionized in the ion activation layer 3 compared with the variable resistance layer 2 and activation energy necessary for ionizing silver Ag can be reduced, the set voltage can be dropped. In the ion activation layer, silver Ag is less easily separated out compared with the variable resistance layer 2. Therefore, the growth of the conductive filament F can be started from an interface between the first electrode 1 and the variable resistance layer 2.

Figure 2D:
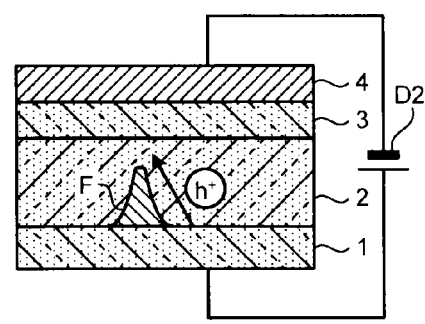

On the other hand, as shown in FIG. 2D, in an extinction process for the conductive filament F, a power supply D2 is connected between the first electrode 1 and the second electrode 4 and the first electrode 1 is set to have higher potential than the second electrode 4 to apply a reset voltage to the second electrode 4.

When the reset voltage is applied to the second electrode 4, a hole $h^+$ is supplied to the variable resistance layer 2 and the ion activation layer 3 via the first electrode 1. Therefore, silver Ag of the conductive filament F is ionized in the variable resistance layer 2 and the ion activation layer 3. The silver ion $Ag^+$ is collected by the second electrode 4 and the conductive filament F is cut in the ion activation layer 3. Therefore, the nonvolatile variable resistance device is reset to the high-resistance state.

Because silver Ag is easily ionized in the ion activation layer 3 compared with the variable resistance layer 2, activation energy necessary for ionizing silver Ag can be reduced and extinction of the conductive filament F can be started from an interface of the ion activation layer 3. Therefore, the reset voltage can be dropped, an extinction start position of the conductive filament F can be fixed, and fluctuation in current-voltage characteristics can be reduced.

The ion activation layer 3 can be caused to act as a high-resistance layer for the silver ion $Ag^+$. Therefore, an OFF current can be reduced and an ON-OFF ratio can be improved.

Because the ion activation layer 3 acts as the high-resistance layer for the silver ion $Ag^+$, the reset can be completed without completely extinguishing the conductive filament F in the variable resistance layer 2. Therefore, switching speed can be improved. When memory application is assumed, a pulse characteristic can also be improved.

Figure 3A:
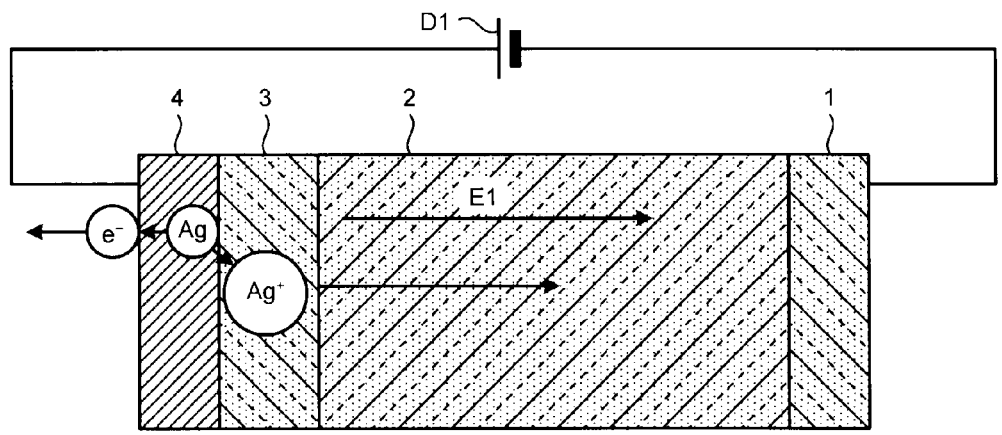
FIGS. 3A to 3C are sectional views for explaining flows of an electron and a metal ion in the generation process for the conductive filament of the nonvolatile variable resistance device shown in FIG. 1.
Figure 3B:
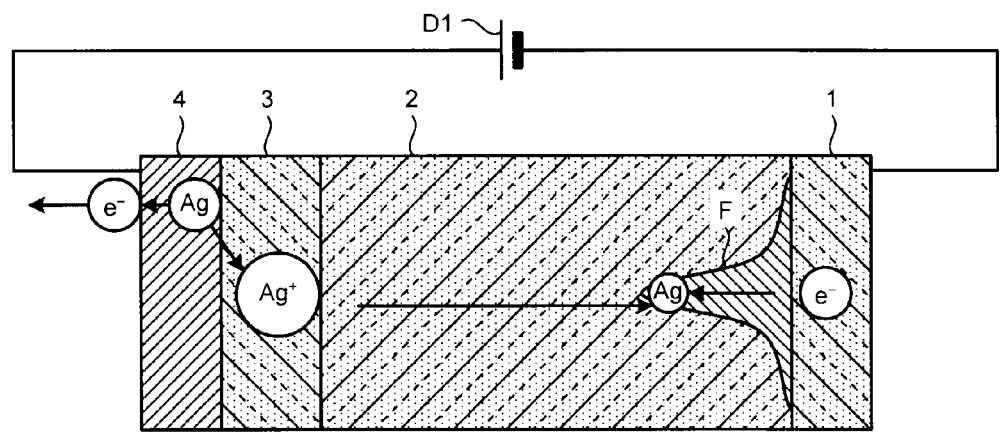
Figure 3C:
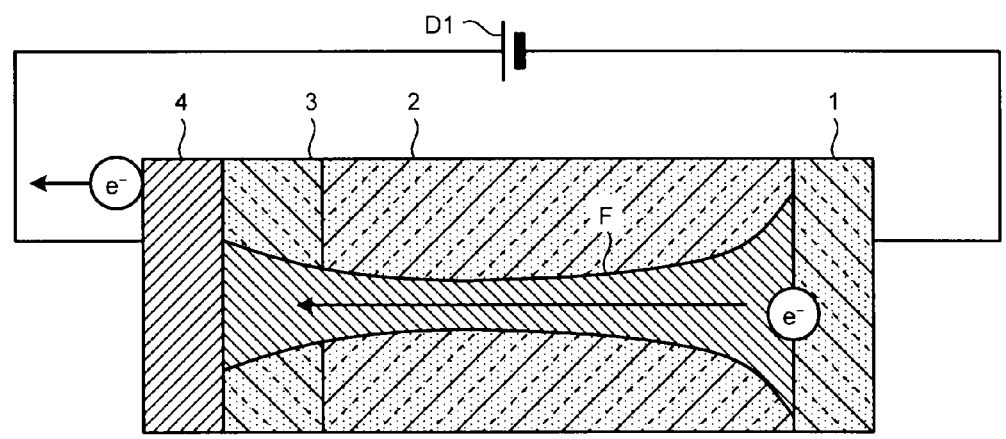

FIGS. 3A to 3C are sectional views for explaining flows of an electron and a metal ion in the generation process for the conductive filament of the nonvolatile variable resistance device shown in FIG. 1.

In FIG. 3A, when a reset voltage is applied to the second electrode 4, an electric field E1 from the second electrode 4 to the first electrode 1 is applied to the variable resistance layer 2. Silver Ag of the second electrode 4 is ionized on the interface between the ion activation layer 3 and the second electrode 4, the silver ion $Ag^+$ intrudes into the variable resistance layer 2, and the electron $e^-$ is supplied to the variable resistance layer 2 via the first electrode 1.

As shown in FIG. 3B, in the variable resistance layer 2, the silver ion $Ag^+$ supplied via the ion activation layer 3 and the electron $e^-$ supplied via the first electrode 1 are coupled, whereby silver Ag is separated out to the variable resistance layer 2 and the conductive filament F grows from the first electrode 1 side.

As shown in FIG. 3C, the conductive filament F grows into the variable resistance layer 2 and the ion activation layer 3 and the first electrode 1 and the second electrode 4 are short-circuited in the conductive filament F. Therefore, the nonvolatile variable resistance device is set to the low-resistance state.

Figure 4A:
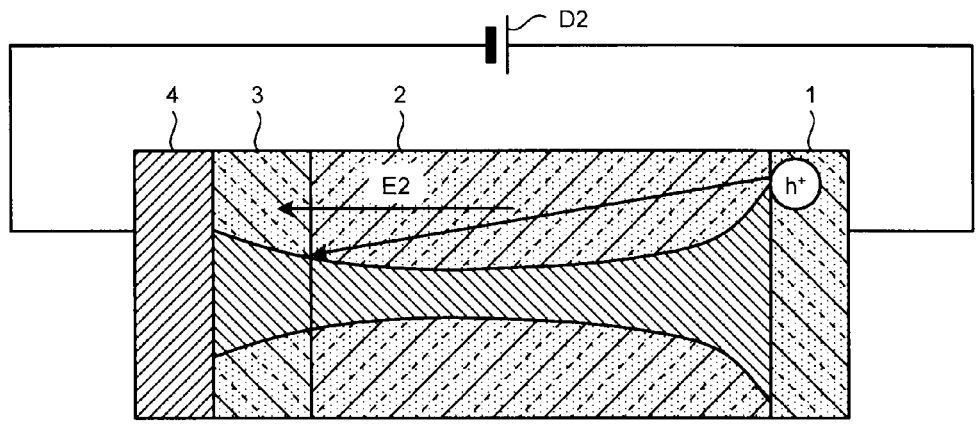
FIGS. 4A and 4B are sectional views for explaining flows of a hole and a metal ion in the extinction process of the conductive filament of the nonvolatile variable resistance device shown in FIG. 1.
Figure 4B:
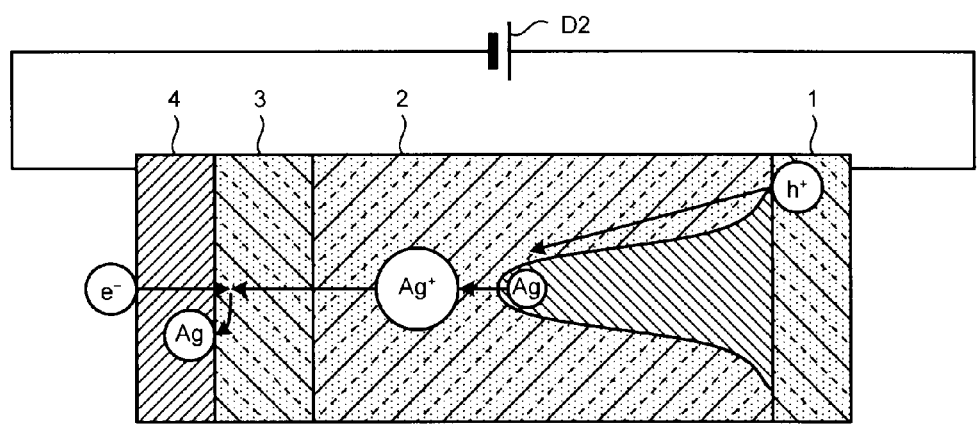

FIGS. 4A and 4B are sectional views for explaining flows of a hole and a metal ion in the extinction process of the conductive filament of the nonvolatile variable resistance device shown in FIG. 1.

In FIG. 4A, when a reset voltage is applied to the second electrode 4, an electric field E2 from the first electrode 1 to the second electrode 4 is applied to the variable resistance layer 2. A hole $h^+$ is supplied to the variable resistance layer 2 and the ion activation layer 3 via the first electrode 1.

As shown in FIG. 4B, when the hole h+ is supplied to the variable resistance layer 2 and the ion activation layer 3, silver Ag of the conductive filament F is ionized in the variable resistance layer 2 and the ion activation layer 3. The silver ion $Ag^+$ travels in the variable resistance layer 2 and the ion activation layer 3 along the electric field E2 and is collected by the second electrode 4. Therefore, the conductive filament F in the variable resistance layer 2 and the ion activation layer is reduced. In the second electrode 4, the silver ion $Ag^+$ is coupled to the electron $e^-$ and returns to silver Ag.

When the conductive filament F in the variable resistance layer 2 and the ion activation layer 3 is further reduced and the conductive filament F is cut in the ion activation layer 3, the nonvolatile variable resistance device is reset to the high-resistance state.

Because silver Ag is easily ionized in the ion activation layer 3 compared with the variable resistance layer 2, extinction of the conductive filament F is started from the interface of the ion activation layer 3 and the ion activation layer 3 acts as a high-resistance layer for the silver ion $Ag^+$. Therefore, the reset can be completed without completely extinguishing the conductive filament F in the variable resistance layer 2.

Figure 5:
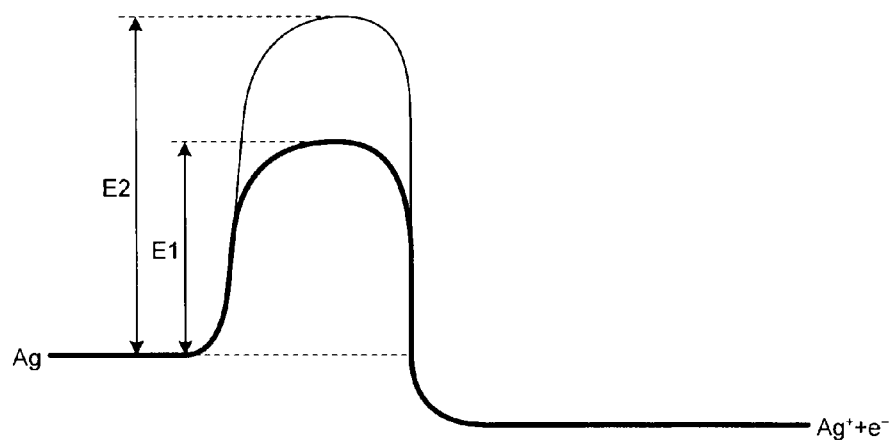
FIG. 5 is a diagram of an increase and decrease in activation energy of a metal element corresponding to presence or absence of an ion activation layer shown in FIG. 1.

FIG. 5 is a diagram of an increase and decrease in activation energy of a metal element corresponding to presence or absence of the ion activation layer shown in FIG. 1.

In FIG. 5, for silver Ag to change to the silver ion $Ag^+$ and the electron $e^-$, a barrier that depends on activation energy needs to be overcome. Activation energy E1 obtained when the ion activation layer 3 is present between the second electrode 4 and the variable resistance layer 2 is smaller than activation energy E2 obtained when the ion activation layer 3 is absent between the second electrode 4 and the variable resistance layer 2. Therefore, a voltage necessary for changing the resistance of the variable resistance layer 2 can be reduced by inserting the ion activation layer 3 between the second electrode 4 and the variable resistance layer 2.

A result obtained by performing formulation based on physical models shown in FIGS. 3 and 4 is explained below.

Electrochemically, an electrode reaction is described by the Butler-Volmer equation shown below.

$$J = 2J_0 \sin h(q_e \Delta \eta_1 / (2k_B T))$$

where, $J_0$ represents a parameter called exchange current density and corresponding to reaction rate of an electrode, $\Delta \eta_1$ represents a parameter called overvoltage for causing the electrode reaction and corresponding to activation energy of the electrode reaction, J represents the density of an electric current flowing to the electrode, $k_B$ represents the Bolzman constant (=1.3807×10$^{-23}$ J/K), T represents absolute temperature (=300K), $q_e$, represents charges of electrons (=1.6022×10$^{-19}$ C).

Length l(t) of the conductive filament F formed on the inside of amorphous silicon is considered to grow by an amount of the charges generated by the electrode reaction. Therefore, the length l(t) can be given by the following formula:

$$dl(t)/dt = 1/(\rho_{Ag} qe) F_f J, \quad 0 < l(t) < 1$$

where, l represents an inter-electrode distance and $\rho_{Ag}$ represents density of Ag crystal (=5.85×10$^{22}$ cm$^{-3}$). $F_f$ represents a normalized effective electrode reaction sectional area. When an effective electrode reaction sectional area is represented as $S_f$ and an electrode area is represented as S, $F_f$ is given by the following formula:

$$F_f = S_f / S$$

A voltage drop $\Delta \eta_2$ that occurs between electrodes is given by the following formula using the conductivity of the conductive filament F (=minimum metallic conductivity ≡2.84× 10$^2$ Ω$^{-1}$ cm$^1$)

$$\Delta\eta_2 = ((1-l(t))/\rho_{Ag}^+ + l(t)/\rho_{Ag}/F_f)J$$

where, $\rho_{Ag}$ represents the conductivity of an Ag ion in amorphous silicon.

A voltage V(t) applied between the electrodes is given by a sum of the surface overvoltage $\Delta\eta_1$ and the voltage drop $\Delta\eta_2$ as indicated by the following formula:

$$V(t) = \Delta\eta_1 + \Delta\eta_2$$

When the electrode area S is set as 50 nm×50 nm and the inter-electrode distance l is set as 80 nanometers, from an experiment result shown in FIG. 6, values described below are obtained as the normalized effective electrode reaction sectional area $F_f$, the conductivity $\rho_{Ag}^+$ of the Ag ion, and the exchange current density $J_0$.

$$F_f = 0.2$$

$$\rho_{Ag}^+ = 9.4 \times 10^{-7} \, \Omega^{-1}\text{cm}^{-1}$$

$$J_0 = 9.4 \times 10^{-17} \, \text{A/cm}^2$$

As a result, it is found that, when amorphous silicon is used for the variable resistance layer 2, about one fifth of the entire electrode is effectively involved in a reaction. A value of the surface overvoltage $\Delta\eta_1$ necessary during set is calculated as 3.2 volts. It is concluded that, when this voltage is exceeded, a rapid increase in an electric current is observed.

Figure 6:
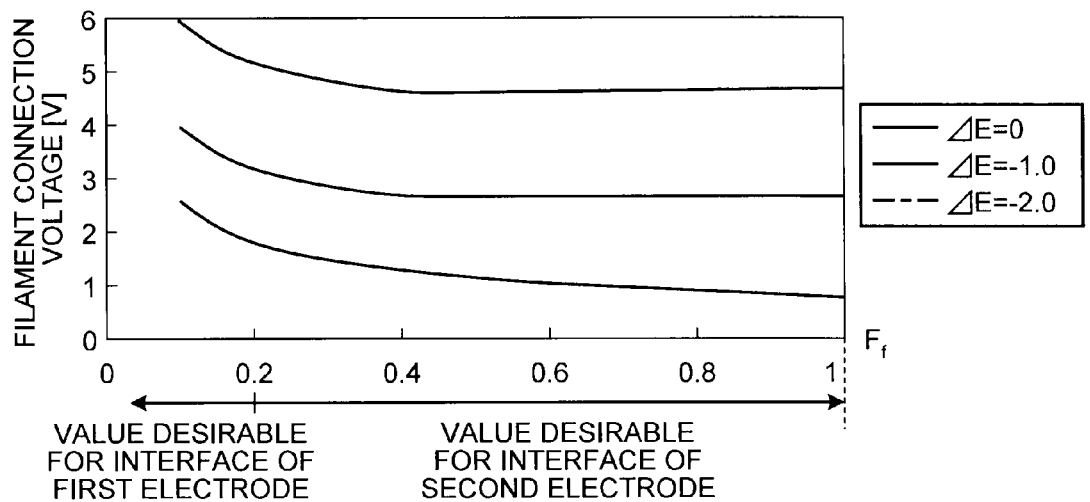
FIG. 6 is a diagram for explaining a relation between a normalized effective electrode reaction sectional area and a filament connection voltage at the time when activation energy of a metal element is changed.

FIG. 6 is a diagram for explaining a relation between a normalized effective electrode reaction sectional area and a filament connection voltage at the time when activation energy of a metal element is changed.

In FIG. 6, concerning the filament connection voltage, dependency of the normalized effective electrode reaction sectional area $F_f$ and the surface overvoltage $\Delta\eta_1$ is calculated. When an surface overvoltage (activation energy) necessary for causing an electrode reaction is reduced, the filament connection voltage drops.

For example, in the case of $F_f = 0.2$, when difference $\Delta E$ of the surface overvoltage necessary for causing the electrode reaction is 0, the filament connection voltage is about 5 volts. On the other hand, when the difference $\Delta E$ is −1, the filament connection voltage is about 3 volts. When the difference $\Delta E$ is −2, the filament connection voltage is about 2 volts.

As a results, when the activation energy drops by at least 1 volt or more, the filament connection voltage drops to be equal to or lower than 3 volts. A driving voltage for the memory can be dropped.

Because dangling bond has high activity, when dangling bond density on an interface between an Ag electrode and an amorphous silicon layer is increased, Ag atoms can be easily ionized. Therefore, activation energy on the interface between the Ag electrode and the amorphous silicon layer can be reduced and the normalized effective electrode reaction sectional area $F_f$ can be increased.

When the dangling bond density increases in the entire amorphous silicon layer because of fixed charges of the dangling bond, the conductivity of the Ag ion in the amorphous silicon falls to not only cause an increase in the driving voltage but also make it easily to cause decomposition of the Ag filament.

Therefore, in an area other than an area near the interface between the Ag electrode and the amorphous silicon layer, it is desirable to set the normalized effective electrode reaction sectional area $F_f$ to a value equal to or smaller than a value ($F_f = 0.2$) of the amorphous silicon layer.

The dangling bond density of the amorphous silicon layer can be associated with spin density of an isolated electron in the amorphous silicon layer. Therefore, the dangling bond density can be estimated by measuring the spin density of the isolated electron in the amorphous silicon layer. The spin density of the isolated electron can be measured by, for example, an electro spin resonance (ESR) method.

There is a correspondence relation between the dangling bond density of the amorphous silicon layer and the number of hydrogen atoms included in the amorphous silicon layer. Therefore, the dangling bond density can be estimated by measuring the number of hydrogen atoms included in the amorphous silicon layer.

For example, in silicon bond terminated by hydrogen, it is considered that, in heat treatment at about 400° C., hydrogen atoms do not separate from silicon atoms and hydrogen atoms not bonding to the silicon atoms are discharged. Therefore, the dangling bond density can be estimated by measuring, with a secondary ion mass microscopy (SIMS) method, the number of hydrogen atoms included in the amorphous silicon layer before and after annealing.

For example, in the configuration shown in FIG. 1, when amorphous silicon is used for the variable resistance layer 2 and the ion activation layer 3 and Ag is used for the second electrode 4, a distribution of hydrogen atoms in the amorphous silicon layer can be measured by an elastic recoil detection analysis (ERDA) method after peeling the Ag electrode. It is possible to obtain a ratio of dangling bond densities on the interface of the amorphous silicon layer and in bulk.

Second Embodiment

A method of manufacturing a nonvolatile variable resistance device according to a second embodiment is explained. In the second embodiment, as an example, p-type Si is used as the first electrode 1 shown in FIG. 1, amorphous silicon is used as the variable resistance layer 2 and the ion activation layer 3 shown in FIG. 1, and silver Ag is used as the second electrode 4 shown in FIG. 1.

For example, a p-type Si region formed by injecting B ions into a silicon monocrystal substrate under a condition that an acceleration voltage is 30 keV and a dosage is $2 \times 10^{15}$ cm$^{-2}$ and then applying activation annealing to the silicon monocrystal substrate is used as the first electrode 1.

For example, an amorphous silicon layer is deposited as the variable resistance layer 2 and the ion activation layer 3 by plasma-enhanced chemical vapor deposition (PECVD). At this point, a dangling bond density ratio in the amorphous silicon layer can be changed by adjusting a flow rate ratio of a monosilane molecule (SiH$_4$), which is a material gas, and hydrogen.

For example, it is known that a light emission intensity ratio of Si* and SiH* in plasma changes with respect to a hydrogen gas ratio in the material gas. Therefore, when Si* in the plasma is increased, dangling bond density in the deposited amorphous silicon layer increases. Therefore, when the amorphous silicon layer is deposited on the first electrode 1, for example, the hydrogen gas ratio can be doubled in the variable resistance layer 2 and a material gas not containing a hydrogen gas can be used in the ion activation layer 3. As such a material gas, for example, a mixed gas of SiH$_4$ and H$_2$ can be used. The dangling bond density ratio can be changed by changing a mixing ratio of SiH$_4$ and H$_2$.

The nonvolatile variable resistance device shown in FIG. 1 can be manufactured by depositing an Ag layer on the ion activation layer 3 as the second electrode 4.

A mixing ratio of the hydrogen gas in the material gas is changed to form the ion activation layer 3 on the variable resistance layer 2. This makes it possible to increase the dangling bond density of the ion activation layer 3 without increasing the dangling bond density of the variable resistance layer 2.

The dangling bond density of the ion activation layer 3 can also be increased by changing the temperature during formation of the ion activation layer 3. However, when the temperature of the variable resistance layer 2 rises during the formation of the ion activation layer 3, the dangling bond density of the variable resistance layer 2 also increases. Therefore, after the variable resistance layer 2 is formed on the first electrode 1, the ion activation layer 3 can be formed on the variable resistance layer 2 by performing laser irradiation on the surface of the variable resistance layer 2 and raising the temperature of only the surface of the variable resistance layer 2.

Third Embodiment

Figure 7:
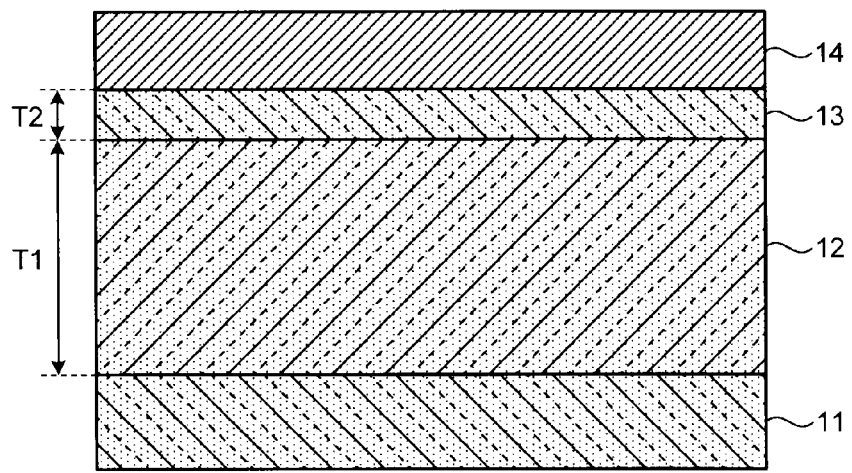
FIG. 7 is a sectional view of a schematic configuration of a nonvolatile variable resistance device according to a third embodiment.

FIG. 7 is a sectional view of a schematic configuration of a nonvolatile variable resistance device according to a third embodiment.

In FIG. 7, in this nonvolatile variable resistance device, a variable resistance layer 12 is stacked on the first electrode 11. A second electrode 14 is stacked on the variable resistance layer 12 via an ion conductive layer 13.

The first electrode 11, the variable resistance layer 12, and the second electrode 14 are the same as the first electrode 1, the variable resistance layer 2, and the second electrode 4 shown in FIG. 1.

In the ion conductive layer 13, the conductivity of an ion of a metal element included in the second electrode 14 is higher than that in the variable resistance layer 12. As the ion conductive layer 13, for example, a metal halogen compound layer or a metal sulfide compound layer can be used. Specifically, as the ion conductive layer 13, for example, AgF, AgCl, AgBr, AgI, $As_2S$, $As_2Se$, CuF, CuCl, CuBr, CuI, $Cu_2S$, $Cu_2Se$, or the like can be used.

If the ion conductive layer 13 can be uniformly present between the variable resistance layer 12 and the second electrode 14, the thickness of the ion conductive layer 13 is desirably small. For example, thickness T1 of the variable resistance layer 12 can be set to 39 nanometers and thickness T2 of the ion conductive layer 13 can be set to 1 nanometer.

When a conductive filament formed of a metal element supplied from the second electrode 4 is formed in the variable resistance layer 12, the nonvolatile variable resistance device changes from a high-resistance state to a low-resistance state. When the metal element of the conductive filament formed in the variable resistance layer 12 is collected by the second electrode 14 and the conductive filament formed in the variable resistance layer 12 is reduced, the nonvolatile variable resistance device changes from the low-resistance state to the high-resistance state.

In the variable resistance layer 12, the metal element of the second electrode 14 is ionized to intrude into the variable resistance layer 12. When the ionized metal element is coupled to electrons, a conductive filament is formed.

On the other hand, in the ion conductive layer 13, because the conductivity of a metal ion is high compared with the variable resistance layer 12, electrons can be deprived from the metal element to allow the metal element to be easily ionized. Activation energy for ionizing the metal element can be reduced.

Therefore, the metal element of the second electrode 14 can be easily ionized by inserting the ion conductive layer 13 between the second electrode 14 and the variable resistance layer 12. Activation energy in forming a conductive filament in the variable resistance layer 12 can be reduced. Therefore, a voltage necessary for changing the resistance of the variable resistance layer 12 can be reduced.

To generate the conductive filament in the variable resistance layer 12, it is necessary to combine the ionized metal element with the electrons. On the other hand, because the ion conductive layer 13 has a stronger action of depriving the electrons from the metal element than the variable resistance layer 12, the ion conductive layer 13 is an obstacle in separating out the conductive filament to the variable resistance layer 12. Therefore, the thickness of the ion conductive layer 13 is desirably small.

Fourth Embodiment

Figure 8:
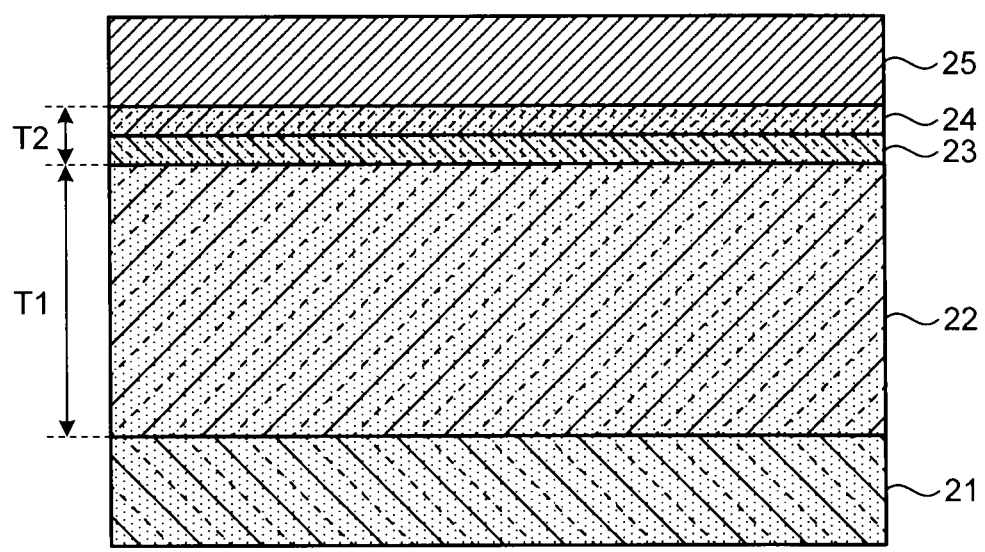
FIG. 8 is a sectional view of a schematic configuration of a nonvolatile variable resistance device according to a fourth embodiment.

FIG. 8 is a sectional view of a schematic configuration of a nonvolatile variable resistance device according to a fourth embodiment.

In FIG. 8, in this nonvolatile variable resistance device, a variable resistance layer 22 is stacked on a first electrode 21. A second electrode 25 is stacked on the variable resistance layer 22 sequentially via an ion activation layer 23 and an ion conductive layer 24.

The first electrode 21, the variable resistance layer 22, the ion activation layer 23, and the second electrode 25 are the same as the first electrode 1, the variable resistance layer 2, the ion activation layer 3, and the second electrode 4 shown in FIG. 1. The ion conductive layer 24 is the same as the ion conductive layer 13 shown in FIG. 7.

When a conductive filament formed of a metal element supplied from the second electrode 25 is formed in the variable resistance layer 22, the nonvolatile variable resistance device changes from a high-resistance state to a low-resistance state. When the metal element of the conductive filament formed in the variable resistance layer 22 is collected by the second electrode 25 and the conductive filament formed in the variable resistance layer 22 is reduced, the nonvolatile variable resistance device changes from the low-resistance state to the high-resistance state.

In the variable resistance layer 22, the metal element of the second electrode 25 is ionized to intrude into the variable resistance layer 22. When the ionized metal element is coupled to electrons, a conductive filament is formed.

On the other hand, in the ion conductive layer 23 and the ion conductive layer 24, the electrons can be deprived from the metal element to allow the metal element to be easily ionized. Activation energy for ionizing the metal element can be reduced.

Therefore, the metal element of the second electrode 25 can be easily ionized by inserting the ion conductive layer 23 and the ion activation layer 24 between the second electrode 25 and the variable resistance layer 22. Activation energy in forming a conductive filament in the variable resistance layer 22 can be reduced. Therefore, a voltage necessary for changing the resistance of the variable resistance layer 22 can be reduced.

Because silver Ag is easily ionized in the ion activation layer 23 compared with the variable resistance layer 22, extinction of the conductive filament F can be started from an interface of the ion activation layer 23. Therefore, an extinction start position of the conductive filament F can be uniformalized and difference in current-voltage characteristics can be reduced.

The ion activation layer 23 can be caused to act as a high-resistance layer for the silver ion $Ag^+$. Therefore, an OFF current can be reduced and an ON-OFF ratio can be improved.

Because the ion activation layer 23 acts as the high-resistance layer for the silver ion $Ag^+$, reset can be completed without completely extinguishing the conductive filament F in the variable resistance layer 22. Therefore, it is possible to improve switching speed. When memory application is assumed, it is also possible to improve a pulse characteristic.

Fifth Embodiment

FIGS. 9A to 9G are sectional views for explaining a method of manufacturing a nonvolatile variable resistance device according to a fifth embodiment. In the fifth embodiment, as an example, p-type Si is used as the first electrode 21 shown in FIG. 8, amorphous silicon is used as the variable resistance layer 22 and the ion activation layer 23 shown in FIG. 8, AgI is used as the ion conductive layer 24 shown in FIG. 8, and silver Ag is used as the second electrode 25 shown in FIG. 8.

Figure 9A:
FIGS. 9A to 9G are sectional views for explaining a method of manufacturing a nonvolatile variable resistance device according to a fifth embodiment.

In FIG. 9A, for example, a p-type Si region formed by injecting B ions into a silicon monocrystal substrate under a condition that an acceleration voltage is 30 keV and a dosage is $2\times10^{15}$ $cm^{-2}$ and then applying activation annealing to the silicon monocrystal substrate is used as the first electrode 21.

For example, an amorphous silicon layer is deposited as the variable resistance layer 22 and the ion activation layer 23 by plasma-enhanced chemical vapor deposition (PECVD).

Figure 9B:
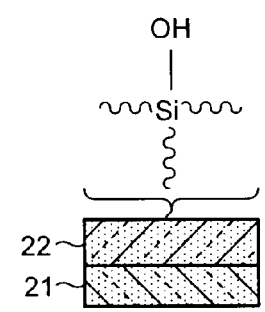

As shown in FIG. 9B, a hydrogen radical is formed on the surface of the amorphous silicon layer by SH cleaning.

Figure 9C:
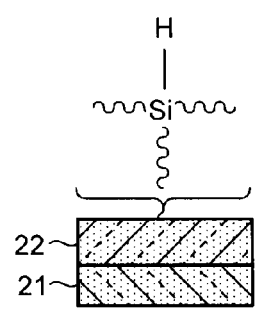

As shown in FIG. 9C, hydrogen termination of the surface of the amorphous silicon layer is performed by subjecting the surface of the amorphous silicon layer, on which the hydrogen radical is formed, to fluoric acid treatment.

Figure 9D:
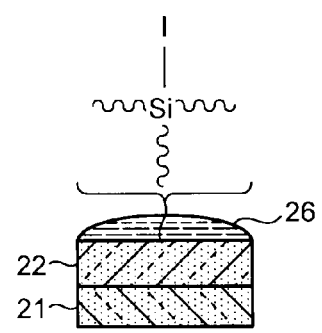

As shown in FIG. 9D, the surface of the amorphous silicon layer is iodized by exposing the surface with an iodinated dehydrated toluene solution 26 obtained by dissolving iodine in dehydrated toluene (toluene not containing water). Hydrogen atoms are replaced with iodine atoms.

Figure 9E:

As shown in FIG. 9E, surface cleaning (rinse) is performed with the dehydrated toluene to remove excess iodine from the iodinated surface of the amorphous silicon layer.

Figure 9F:
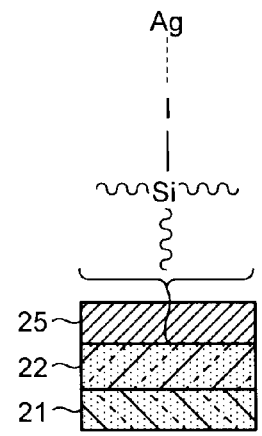

As shown in FIG. 9F, Ag is deposited on the iodinated surface of the amorphous silicon layer to manufacture the second electrode 25.

Figure 9G:
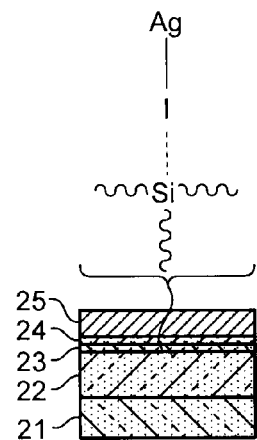

As shown in FIG. 9G, the iodinated amorphous silicon layer is subjected to heat treatment at about 300° C. At this point, silver atoms and iodine atoms bond together and AgI is generated on an interface between the variable resistance layer 22 and the second electrode 25 and, moreover, the bonding of the iodine atoms and the silicon atoms are cut. Therefore, dangling bond is generated on an interface of the amorphous silicon layer. As a result, the ion activation layer 23 and the ion conductive layer 24 are formed between the variable resistance layer 22 and the second electrode 25.

Consequently, the dangling bond can be formed on the surface of the amorphous silicon layer at temperature of about 300° C. AgI can be stacked on the dangling bond. The ion activation layer 23 and the ion conductive layer 24 can be formed on the variable resistance layer 22 without increasing the dangling bond density of the variable resistance layer 22.

When the amorphous silicon layer is manufactured, the dangling bond density ratio in the amorphous silicon layer can also be changed by adjusting a flow rate ratio of a monosilane molecule ($SiH_4$), which is a material gas, and hydrogen. It is possible to further reduce, by increasing the dangling bond density of the amorphous silicon layer on an AgI layer interface, a voltage at which the Ag electrode decomposes.

Sixth Embodiment

FIGS. 10A to 10G are sectional views for explaining a method of manufacturing a nonvolatile variable resistance device according to a sixth embodiment.

In FIGS. 10A to 10G, steps shown in FIGS. 10A to 10E are the same as the steps shown in FIGS. 9A to 9E.

Figure 10A:
FIGS. 10A to 10G are sectional views for explaining a method of manufacturing a nonvolatile variable resistance device according to a sixth embodiment.
Figure 10B:
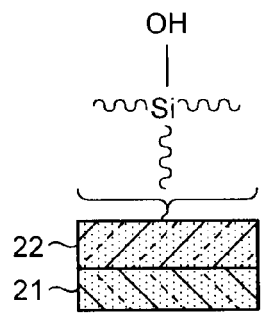
Figure 10C:
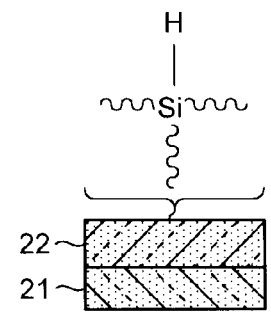
Figure 10D:
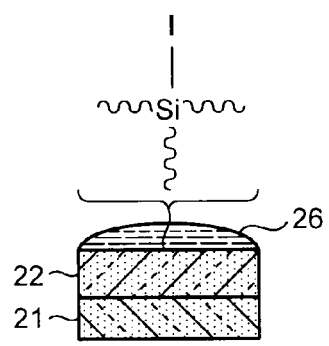
Figure 10E:
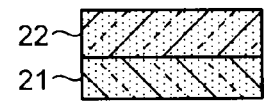
Figure 10F:
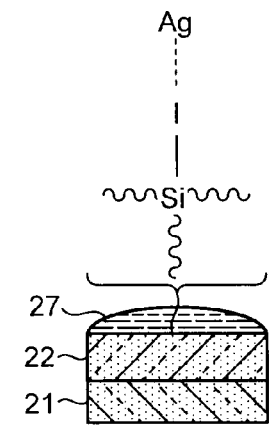

As shown in FIG. 10F, the surface of the amorphous silicon layer is exposed with a silver nitrate solution 27 obtained by dissolving silver nitrate ($AgNO_3$) in tetrahydrafuran.

Figure 10G:
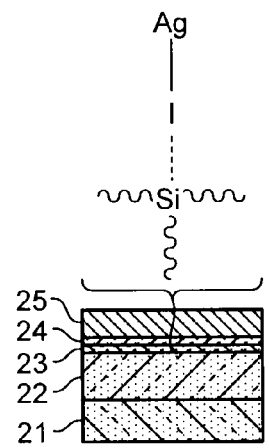

As shown in FIG. 10G, the amorphous silicon layer exposed with the silver nitrate solution 27 is subjected to heat treatment at about 100° C. to manufacture the second electrode 25. At this point, silver atoms and iodine atoms bond together and an AgI is generated on the interface between the variable resistance layer 22 and the second electrode 25 and, moreover, the bonding of the iodine atoms and the silicon atoms are cut. Therefore, dangling bond is generated on an interface of the amorphous silicon layer. As a result, the ion activation layer 23 and the ion conductive layer 24 are formed between the variable resistance layer 22 and the second electrode 25.

Consequently, it is possible to form the dangling bond on the surface of the amorphous silicon layer at temperature of about 100° C. It is possible to stack AgI on the dangling bond. It is possible to form the ion activation layer 23 and the ion conductive layer 24 on the variable resistance layer 22 without increasing the dangling bond density of the variable resistance layer 22.

Seventh Embodiment

Figure 11A:
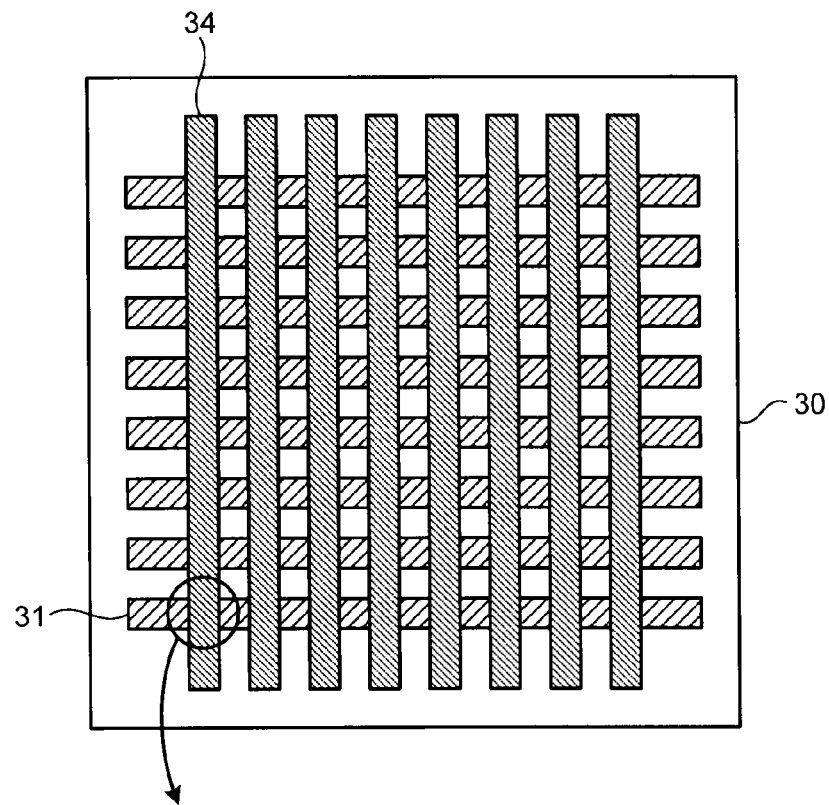
FIG. 11A is a plan view of a schematic configuration of a memory cell array to which a nonvolatile variable resistance device according to a seventh embodiment is applied.
Figure 11B:
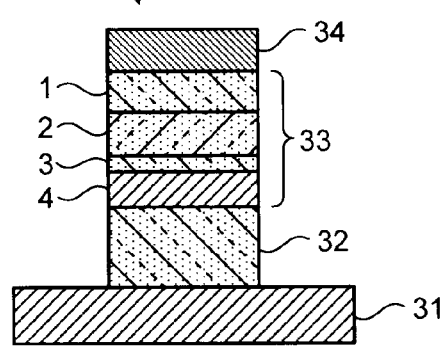
FIG. 11B is a sectional view of a schematic configuration of a cross point section of the memory cell array shown in FIG. 11A.

FIG. 11A is a plan view of a schematic configuration of a memory cell array to which a nonvolatile variable resistance device according to a seventh embodiment is applied. FIG. 11B is a sectional view of a schematic configuration of a cross point section of the memory cell array shown in FIG. 11A.

In FIGS. 11A and 11B, in a memory cell array 30, lower wires 31 are formed in a column direction and upper wires 34 are formed in a row direction. Nonvolatile variable resistance elements 33 are arranged in cross point sections between the lower wires 31 and the upper wires 34 via rectifying elements 32. As the nonvolatile variable resistance devices 33, for example, the nonvolatile variable resistance device shown in FIG. 1, 7, or 8 can be used. In an example shown in FIG. 11B, a method of providing the rectifying elements 32 in the nonvolatile variable resistance devices 33 is explained. However, the rectifying elements 32 can be removed.

Figure 12:
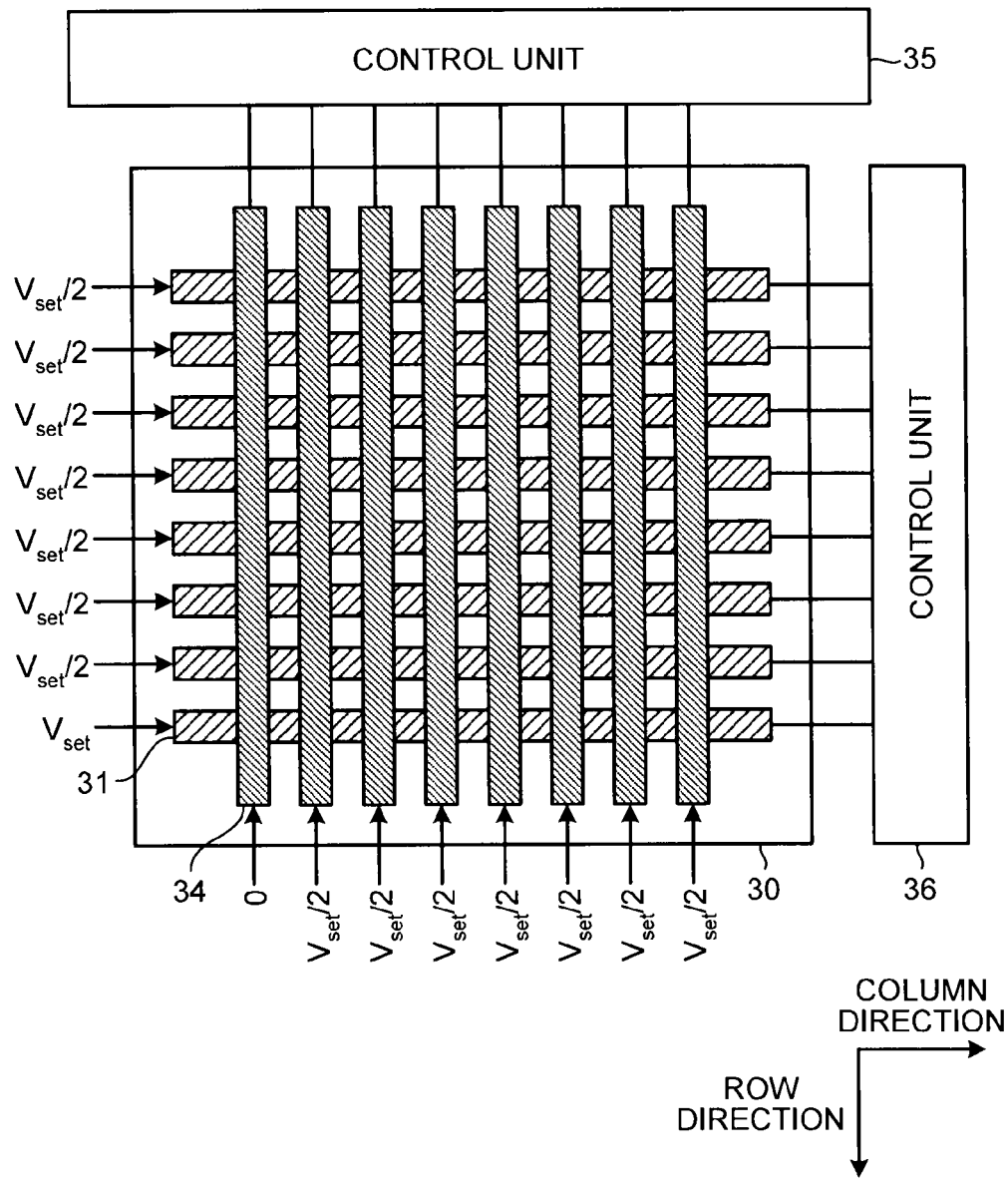
FIG. 12 is a plan view for explaining a voltage setting method during writing in a selected cell in the memory cell array shown in FIG. 11A.

FIG. 12 is a plan view for explaining a voltage setting method during writing in a selected cell in the memory cell array shown in FIG. 11A.

In FIG. 12, a control unit 35 that performs row selection and a control unit 36 that performs column selection are provided around the memory cell array 30. When writing in a selected cell is performed, a set voltage Vset is applied to the lower wire 31 in a selected column and a voltage of ½ of the set voltage Vset is applied to the lower wires 31 in unselected columns. 0 volt is applied to the upper wire 34 in a selected row and the voltage of ½ of the set voltage Vset is applied to the upper wires 34 in unselected rows.

As a result, the set voltage Vset is applied to the selected cell designated by the selected column and the selected row and writing in the selected cell is performed. On the other hand, the voltage of ½ of the set voltage Vset is applied to half-selected cells designated by the unselected columns and the selected row and writing in the half-selected cells is prohibited. The voltage of ½ of the set voltage Vset is applied to half-selected cells designated by the selected column and the unselected rows and writing in the half-selected cells is prohibited. 0 volt is applied to unselected cells designated by the unselected columns and the unselected rows and writing in the unselected cells is prohibited.

Figure 13:
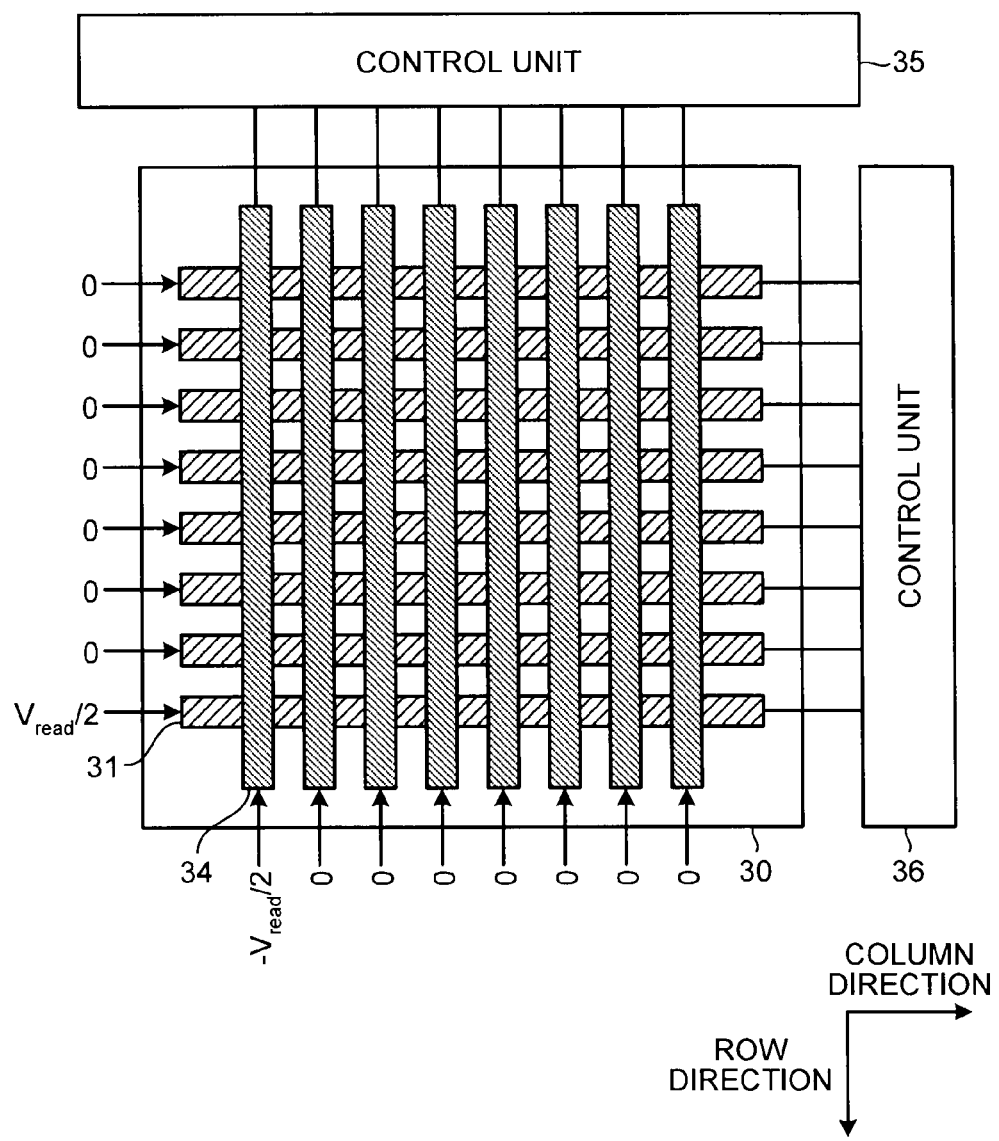
FIG. 13 is a plan view for explaining a voltage setting method during readout from the selected cell in the memory cell array shown in FIG. 11A.

FIG. 13 is a plan view for explaining a voltage setting method during readout from the selected cell in the memory cell array shown in FIG. 11A.

In FIG. 13, when readout from the selected cell is performed, a voltage of ½ of a read voltage Vread is applied to the lower wire 31 in the selected column and 0 volt is applied to the lower wires 31 in the unselected columns. A voltage of −½ of the read voltage Vread is applied to the upper wire 34 in the selected row and 0 volt is applied to the upper wires 34 in the unselected rows.

As a result, the read voltage Vread is applied to the selected cell designated by the selected column and the selected row and readout from the selected cell is performed. On the other hand, the voltage of −½ of the read voltage Vread is applied to half-selected cells designated by the unselected columns and the selected row and readout from the half-selected cells is prohibited. The voltage of ½ of the read voltage Vread is applied to half-selected cells designated by the selected column and the unselected rows and readout from the half-selected cells is prohibited. 0 volt is applied to the unselected cells designated by the unselected columns and the unselected rows and readout from the unselected cells is prohibited.

Figure 14:
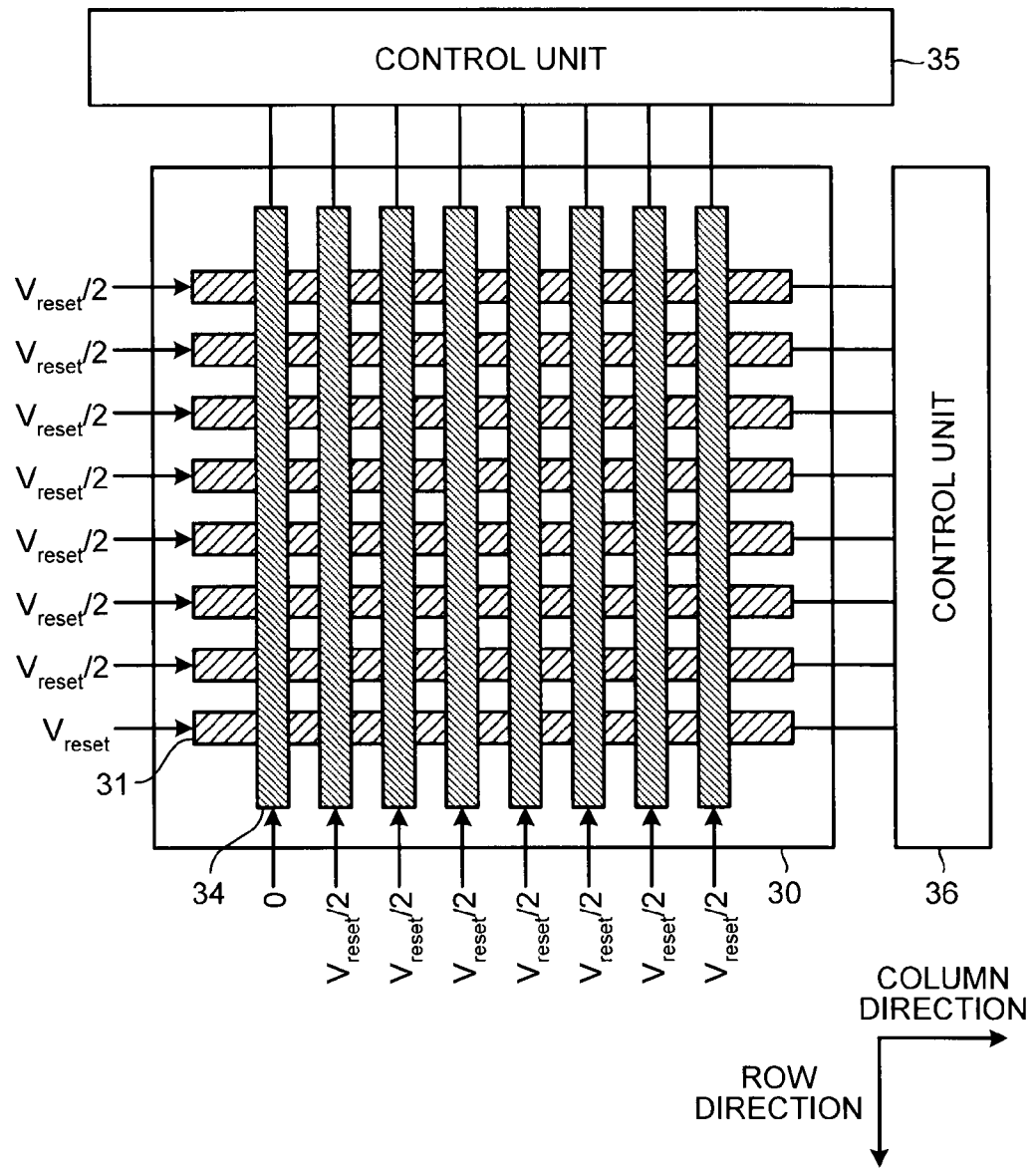
FIG. 14 is a plan view for explaining a voltage setting method during erasing of the selected cell in the memory cell array shown in FIG. 11A.

FIG. 14 is a plan view for explaining a voltage setting method during erasing of the selected cell in the memory cell array shown in FIG. 11A.

In FIG. 14, when erasing of the selected cell is performed, a reset voltage Vreset is applied to the lower wire 31 in the selected column and a voltage of ½ of the reset voltage Vreset is applied to the lower wires 31 in the unselected columns. 0 volt is applied to the upper wire 34 in the selected row and the voltage of ½ of the reset voltage Vreset is applied to the upper wires 34 in the unselected rows.

As a result, the reset voltage Vreset is applied to the selected cell designated by the selected column and the selected row and erasing of the selected cell is performed. On the other hand, the voltage of ½ of the reset voltage Vreset is applied to the half-selected cells designated by the unselected columns and the selected row and erasing of the half-selected cells is prohibited. The voltage of ½ of the reset voltage Vreset is applied to the half-selected cells designated by the selected column and the unselected rows and erasing of the half-selected cells is prohibited. 0 volt is applied to the unselected cells designated by the unselected columns and the unselected rows and erasing of the unselected cells is prohibited.

Eighth Embodiment

Figure 15:
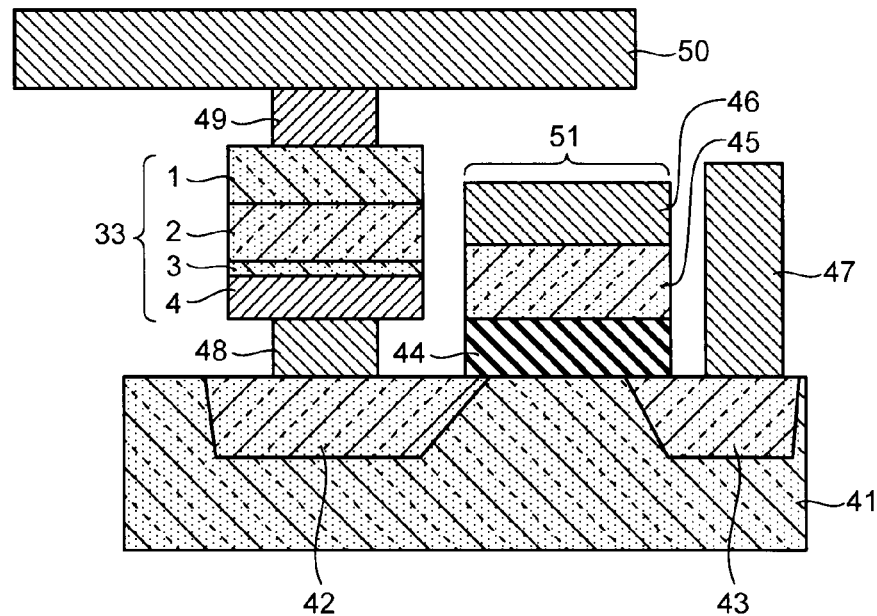
FIG. 15 is a sectional view of a schematic configuration of a nonvolatile variable resistance device according to an eighth embodiment.

FIG. 15 is a sectional view of a schematic configuration of a nonvolatile variable resistance device according to an eighth embodiment.

In FIG. 15, a gate electrode 45 is formed on a semiconductor substrate 41 via a gate insulating film 44. A word line 46 is formed on the gate electrode 45. In the semiconductor substrate 41, impurity diffusion layers 42 and 43 are formed to hold a channel region, which is formed under the gate electrode 45, between the impurity diffusion layers 42 and 43 to form a transistor 51. A source line 47 is connected to the impurity diffusion layer 43.

A nonvolatile variable resistance device 33 is arranged on the semiconductor substrate 41 to be adjacent to the transistor 51. As the nonvolatile variable resistance device 33, for example, a configuration same as that shown in FIG. 1 can be used. The second electrode 4 of the nonvolatile variable resistance device 33 is connected to the impurity diffusion layer 42 via a connection conductor 48. The first electrode 1 of the nonvolatile variable resistance device 33 is connected to a bit line 50 via a connector conductor 49.

The transistor 51 is turned on via the word line 46, whereby the nonvolatile variable resistance device 33 can be accessed. The nonvolatile variable resistance device 33 as a writing target can be selected.

In the explanation of the example shown in FIG. 15, the configuration shown in FIG. 1 is used as the nonvolatile variable resistance device 33. However, the configuration shown in FIG. 7 or 8 can also be used.

Figure 16:
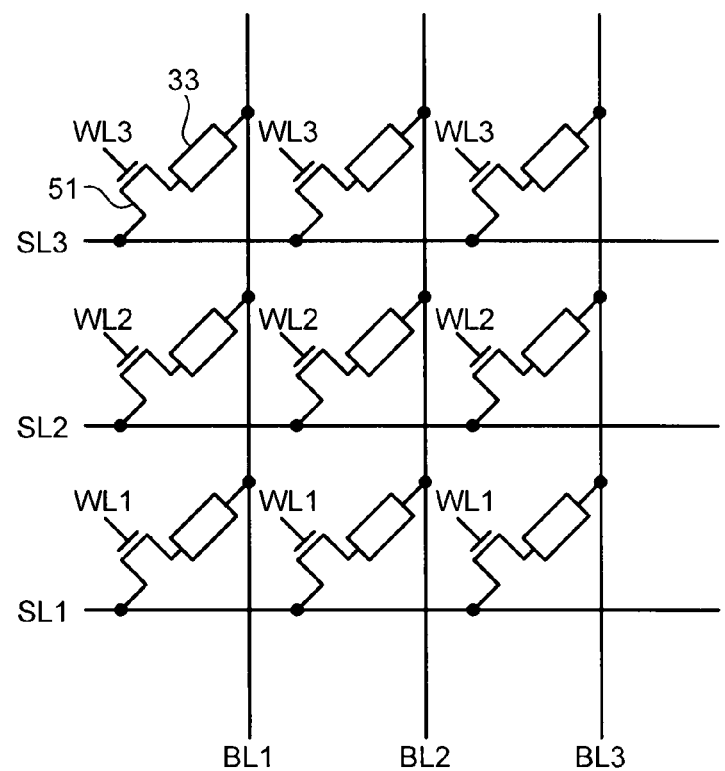
FIG. 16 is a plan view of a schematic configuration of a memory cell array to which the nonvolatile variable resistance device shown in FIG. 15 is applied.

FIG. 16 is a plan view of a schematic configuration of a memory cell array to which the nonvolatile variable resistance device shown in FIG. 15 is applied.

In FIG. 16, on the semiconductor substrate 41 shown in FIG. 15, bit lines BL1 to BL3 are wired in a column direction and word lines WL1 to WL3 are wired in a row direction. The nonvolatile variable resistance devices 33 and the transistors 51 are arranged in cross point sections of the bit lines BL1 to BL3 and the word lines WL1 to WL3. The nonvolatile variable resistance devices 33 and the transistors 51 are connected in series to each other.

One ends of the nonvolatile variable resistance devices 33 in the same column are connected to the same bit lines BL1 to BL3. One ends of the transistors 51 in the same row are connected to the same source lines SL1 to SL3. The gate electrodes 45 of the transistors 51 in the same row are connected to the same word lines Wl1 to WL3.

The transistors 51 are turned on via the word lines WL1 to WL3, whereby a voltage can be applied between the first electrode 1 and the second electrode 4 of the nonvolatile variable resistance device 33 in a selected row. Therefore, it is possible to prevent an electric current from flowing to the nonvolatile variable resistance devices 33 in unselected rows during readout from the nonvolatile variable resistance device 33 in the selected row. Therefore, it is possible to reduce readout time.

Ninth Embodiment

Figure 17:
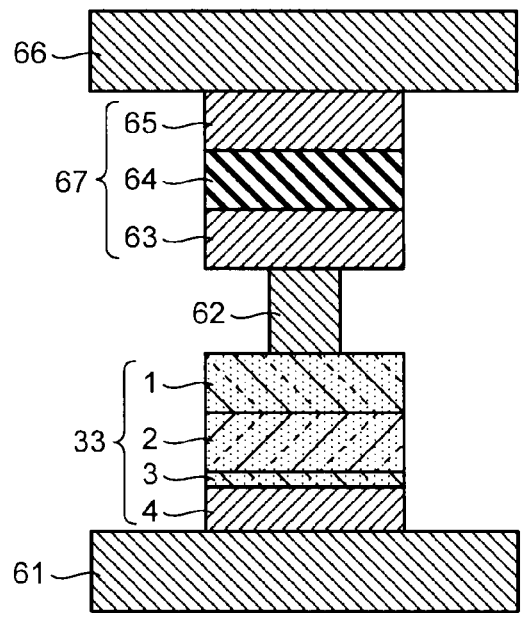
FIG. 17 is a sectional view of a schematic configuration of a nonvolatile variable resistance device according to a ninth embodiment.

FIG. 17 is a sectional view of a schematic configuration of a nonvolatile variable resistance device according to a ninth embodiment.

In FIG. 17, the nonvolatile variable resistance device 33 is arranged on a lower wire 61. A unipolar variable resistance element 67 is arranged on the nonvolatile variable resistance device 33 via a connection conductor 62. An upper wire 66 is arranged on the unipolar variable resistance element 67. In the unipolar variable resistance element 67, a variable resistance layer 64 is stacked on a lower electrode 63 and an upper electrode 65 is stacked on the variable resistance layer 64. As the variable resistance layer 64, a transition metal oxide such as $HfO_2$, $ZrO_2$, $NiO$, $V_2O_5$, $ZnO$, $TiO_2$, $Nb_2O_5$, $WO_3$, or $CoO$ can be used. In the unipolar variable resistance element 67, the resistance of the variable resistance layer 64 can be changed by changing the amplitude and the time of a pulse stress applied to the variable resistance layer 64.

When a forward bias is applied to the unipolar variable resistance element 67, the set voltage Vset is applied to the nonvolatile variable resistance device 33 via the lower wire 61. This makes it possible to form the conductive filament F shown in FIG. 3A in the variable resistance layer 2 and reduce the resistance of the nonvolatile variable resistance device 33.

On the other hand, when a reverse bias is applied to the unipolar variable resistance element 67, the reset voltage Vreset is applied to the nonvolatile variable resistance device 33 via the lower wire 61. This makes it possible to extinguish the conductive filament F shown in FIG. 3A from the variable resistance layer 2 and increase the resistance of the nonvolatile variable resistance device 33.

When the nonvolatile variable resistance device 33 is connected in series to the unipolar variable resistance element 67, a higher ON-OFF ratio can be obtained compared with an ON-OFF ratio obtained when a diode is connected in series to the unipolar variable resistance element 67.

In the explanation of the example shown in FIG. 17, the configuration shown in FIG. 1 is used as the nonvolatile variable resistance device 33. However, the configuration shown in FIG. 7 or 8 can also be used.

Figure 18:
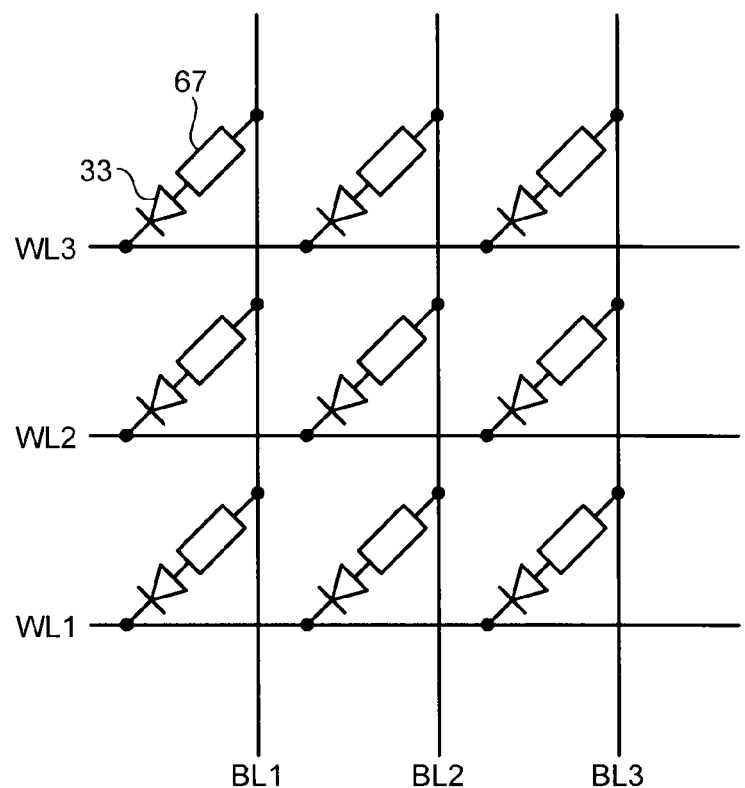
FIG. 18 is a plan view of a schematic configuration of a memory cell array to which the nonvolatile variable resistance device shown in FIG. 17 is applied.

FIG. 18 is a plan view of a schematic configuration of a memory cell array to which the nonvolatile variable resistance device shown in FIG. 17 is applied.

In FIG. 18, the bit lines BL1 to BL3 are wired in a column direction and the word lines WL1 to WL3 are wired in a row direction. The nonvolatile variable resistance devices 33 and the unipolar variable resistance elements 67 are arranged in cross point sections of the bit lines BL1 to BL3 and the word lines WL1 to WL3. The nonvolatile variable resistance devices 33 and the unipolar variable resistance elements 67 are connected in series to each other.

One ends of the unipolar variable resistance elements 67 in the same column are connected to the same bit lines BL1 to BL3. One ends of the nonvolatile variable resistance devices 33 in the same row are connected to the same word lines WL1 to WL3.

By connecting the nonvolatile variable resistance devices 33 and the unipolar variable resistance elements 67 in this way, when a reverse bias is applied to unselected cells, the resistance of the variable resistance element is increased. Therefore, it is possible to reduce current noise flowing from the unselected cells during current readout from a selected cell. It is possible to improve stability of a readout operation and reduce readout time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile variable resistance device comprising:
a first electrode;
a second electrode including a metal element;
first, second and third layers;
said first layer arranged between the first electrode and the second electrode and including a semiconductor element;
said second layer inserted between the third layer and the first layer, wherein a percentage of the semiconductor element being unterminated is higher in the second layer than in the first layer; and
said third layer inserted between the second electrode and the first layer and having conductivity of an ion of the metal element higher than that of the first layer.

2. The nonvolatile variable resistance device according to claim 1, wherein the third layer is a metal halogen compound layer or a metal sulfide compound layer.

3. The nonvolatile variable resistance device according to claim 1, wherein the third layer is selected out of AgF, AgCl, AgBr, AgI, $As_2S$, $As_2Se$, CuF, CuCl, CuBr, CuI, $Cu_2S$, and $Cu_2Se$.

4. The nonvolatile variable resistance device according to claim 1, wherein the first layer is formed of silicon atoms.

5. The nonvolatile variable resistance device according to claim 4, wherein the first electrode is impurity-doped silicon.

6. The nonvolatile variable resistance device according to claim 5, wherein the second electrode is selected out of Ag, Au, Ti, Ni, Co, Al, Fe, Cr, Cu, W, Hf, Ta, Pt, Ru, Zr, and Ir.

7. The nonvolatile variable resistance device according to claim 1, wherein the nonvolatile variable resistance device changes from a high-resistance state to a low-resistance state when a conductive filament formed of the metal element is formed in the first layer and changes from the low-resistance state to the high-resistance state when the conductive filament in the first layer is reduced.

8. The nonvolatile variable resistance device according to claim 1, wherein a stacked structure of the first electrode, the first layer, the third layer, and the second electrode is arranged at a cross point of a word line and a bit line.

9. The nonvolatile variable resistance device according to claim 8, further comprising a rectifying device arranged between the word line and the bit line.

10. A nonvolatile variable resistance device according to claim 1, wherein the thickness of the third layer is smaller than the thickness of the first layer.

* * * * *